United States Patent
Proebstle (10) Patent No.: US 11,888,339 B2
(45) Date of Patent: Jan. 30, 2024

(54) METHOD AND CONTROL UNIT FOR MONITORING AN ENERGY ACCUMULATOR

(71) Applicant: Bayerische Motoren Werke Aktiengesellschaft, Munich (DE)

(72) Inventor: Hartmut Proebstle, Wuerzburg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 752 days.

(21) Appl. No.: 16/980,523

(22) PCT Filed: Mar. 15, 2019

(86) PCT No.: PCT/EP2019/056572
§ 371 (c)(1),
(2) Date: Sep. 14, 2020

(87) PCT Pub. No.: WO2019/185371
PCT Pub. Date: Oct. 3, 2019

(65) Prior Publication Data
US 2021/0013554 A1    Jan. 14, 2021

(30) Foreign Application Priority Data
Mar. 29, 2018  (DE) ..................... 10 2018 204 924.6

(51) Int. Cl.
*H02J 7/00*    (2006.01)
*G01R 31/387*  (2019.01)
*H01M 10/42*   (2006.01)

(52) U.S. Cl.
CPC .......... *H02J 7/0071* (2020.01); *G01R 31/387* (2019.01); *H01M 10/425* (2013.01);
(Continued)

(58) Field of Classification Search
CPC ........ H02J 7/0071; H02J 7/0048; H02J 7/005; H02J 7/14; G01R 31/387; H01M 10/425;
(Continued)

(56) References Cited

U.S. PATENT DOCUMENTS 9,442,165 B2    9/2016  Asghari et al.
2005/0001625 A1 1/2005  Ashtiani et al.
(Continued)

FOREIGN PATENT DOCUMENTS

CN    104620467 A    5/2015
CN    107294120 A  * 10/2017  ....... G06Q 10/06315
(Continued)

OTHER PUBLICATIONS

Davitian et al., One the economic assessment and optimization of energy storage systems, 1979, Energy, 4, 1099-1105 (Year: 1979).*
(Continued)

*Primary Examiner* — Daniel S Gatewood
(74) *Attorney, Agent, or Firm* — Crowell & Moring LLP (57) ABSTRACT

During an operation of the energy accumulator, a control unit is designed to detect event data relating to different charging/discharging events of the energy accumulator. The event data for a charging/discharging event indicates an event discharge depth of the energy accumulator within the scope of the charging discharging event. In addition, the control unit is designed to determine a discharge depth distribution based on the discharge data, which indicates a number of charging/discharging events with a corresponding event discharge depth for different discharge depths during the operation of the energy accumulator. The control unit is designed to determine status data relating to a cumulative charging of the energy accumulator based on the discharge depth distribution and based on a discharge depth characteristic curve of the energy accumulator, and/or to adjust an (Continued)

operating strategy for the energy accumulator depending on the discharge depth distribution and the discharge depth characteristic curve.

13 Claims, 3 Drawing Sheets

(52) U.S. Cl.
CPC ............ *H02J 7/005* (2020.01); *H02J 7/0048* (2020.01); *H01M 2010/4271* (2013.01); *H01M 2010/4278* (2013.01); *H01M 2220/20* (2013.01)

(58) Field of Classification Search
CPC . H01M 2010/4271; H01M 2010/4278; H01M 2220/20; Y02E 60/10
See application file for complete search history.

(56) References Cited

U.S. PATENT DOCUMENTS

| | | | |
|---|---|---|---|
| 2012/0053837 A1 | 3/2012 | Viassolo et al. | |
| 2014/0077752 A1 | 3/2014 | Barsukov et al. | |
| 2014/0139191 A1 | 5/2014 | Asghari et al. | |
| 2014/0214349 A1 | 7/2014 | Dong et al. | |
| 2015/0369867 A1 | 12/2015 | Kanada | |
| 2016/0134146 A1* | 5/2016 | Ling | H01M 10/48 320/136 |
| 2018/0076645 A1* | 3/2018 | Bamberger | H02J 7/00711 |

FOREIGN PATENT DOCUMENTS

| | | | | |
|---|---|---|---|---|
| CN | 107294120 A | 10/2017 | | |
| CN | 107408831 A | 11/2017 | | |
| CN | 107437135 A | * 12/2017 | ......... | G06Q 10/0637 |
| CN | 107437135 A | 12/2017 | | |
| DE | 195 40 827 A1 | 5/1996 | | |

OTHER PUBLICATIONS

Davitian et al., "On the Economic Assessment and Optimization of Energy Storage Systems", Energy, vol. 4, No. 6F, pp. 1099-1105, (seven (7) pages).
Chinese-language Office Action issued in Chinese Application No. 201980021732.X dated Apr. 28, 2023 with English translation (20 pages).
International Search Report (PCT/ISA/210) issued in PCT Application No. PCT/EP2019/056572 dated Jun. 14, 2019 with English translation (six (6) pages).
German-language Written Opinion (PCT/ISA/237) issued in PCT Application No. PCT/EP2019/056572 dated Jun. 14, 2019 (nine (9) pages).
German-language Search Report issued in German Application No. 10 2018 204 924.6 dated Jan. 18, 2019 with partial English translation (11 pages).

* cited by examiner

METHOD AND CONTROL UNIT FOR MONITORING AN ENERGY ACCUMULATOR

BACKGROUND AND SUMMARY OF THE INVENTION

The invention relates to a method and to a corresponding control unit for monitoring an energy accumulator, particularly in the on-board electrical network of a vehicle.

A vehicle, particularly a road vehicle, typically comprises at least one electrical energy accumulator, in order to store electrical energy for the operation of electrical loads (e.g. a starter, an air-conditioning system, a lighting system, etc.) of the vehicle. In particular, a vehicle comprises an electrochemical energy accumulator for this purpose, for example a lead-acid accumulator.

An electrochemical energy accumulator is subject to loading by cyclical discharging and charging. This loading typically depends on the discharge depth of the individual discharging/charging cycles. For the determination of the loading of an energy accumulator, the sum of the discharging/charging cycles, independently of the respective charge/discharge depth, can be detected and compared with a maximum permissible number of cycles. Typically, however, this comparison provides only a relatively rough estimation of the cumulative loading of an energy accumulator. In consequence, the residual service life of an energy accumulator can only be determined with an insufficient degree of accuracy, with the potential result that energy accumulators are replaced too early or too late (which can result in increased costs or impairments of the driving performance of a vehicle).

The present document addresses the technical object of determining the cumulative state of loading of an (electrochemical) energy accumulator, particularly of a lead-based battery, with increased accuracy. The present document also addresses the technical object of increasing the service life of an energy accumulator in a reliable and efficient manner.

The object is achieved by the independent claims. Advantageous forms of embodiment are described inter alia in the dependent claims. It should be observed that additional features of a patent claim which is dependent on an independent claim, in the absence of the features of the independent patent claim or just in combination with a proportion of the features of the independent patent claim, can form a separate invention which is independent of the combination of all the features of the independent patent claim and which can be made the subject matter of an independent claim, a divisional application or a subsequent application. This applies in the same way to technical instruction described in the description, which can form an invention which is independent of the features of the independent patent claims.

According to one aspect, a control unit for an energy accumulator is described. The energy accumulator can be operated in an on-board electrical network of a vehicle, particularly of a road vehicle. In this case, electrical energy can be drawn from the energy accumulator, in order to operate one or more electrical loads. Secondly, by means of an energy source (e.g. by means of a generator, a DC voltage converter and/or another energy accumulator), electrical energy can be provided in order to charge the energy accumulator. The energy accumulator can comprise a lead-acid battery and/or an AGM battery or a lithium-based battery, or a combination of a plurality of energy accumulators at the same or different voltage levels.

The control unit is designed to detect event data relating to different discharging/charging events of the energy accumulator during the operation of the energy accumulator. To this end, one or more state-of-charge sensors can be employed which are typically integrated in proximity to the accumulator (such as e.g. an IBS, or Integrated Battery Sensor, in the case of lead-acid batteries, or current-voltage sensors in the case of lithium batteries). Here, event data can be determined and saved with effect from the entry into service of the energy accumulator.

A discharging/charging event can be defined to the effect that a discharging/charging event extends exactly over N discharging processes and/or N charging processes of the energy accumulator, wherein N can be equal to or less than 10, 5, 4, 3, 2 or 1. In particular, each individual discharging process and/or charging process of the energy accumulator can be defined as a discharging/charging event. A detailed detection of the discharging and/or charging behavior of the energy accumulator can thus be carried out.

During the travel of a vehicle, typically a relatively large number of individual discharging processes and charging processes can occur (e.g. 100, 1 000 or more). This applies particularly to vehicles which employ brake energy recovery and/or in the event of urban travel. For each of these discharging processes and/or charging processes, a discharging/charging event can be defined and/or saved. Optionally, N directly sequential discharging processes and/or charging processes can be combined to form a single discharging/charging event, in order to reduce the quantity of detected and/or saved data. A compromise can thus be made between the accuracy of the detection of the loading of the energy accumulator and the saved quantity of data.

A discharging/charging event can be delimited by a transition between a charging process and a discharging process and/or by a transition between a discharging process and a charging process. In particular, the start and/or the end of a discharging/charging event can be triggered by the interruption of a charging process of the energy accumulator.

Typically, the temporal profile of the state-of-charge of an energy accumulator features alternating subregions with a negative gradient (during a discharging process) and with a positive gradient (during a charging process). Each subregion with a negative gradient and/or each subregion with a positive gradient can be detected and saved as an individual discharging/charging event.

The event data for a discharging/charging event can indicate an event discharge depth of the energy accumulator in the context of the discharging/charging event. The corresponding event discharge depth can thus be detected and saved for each discharging/charging event. The energy accumulator, in the context of a discharging/charging event, typically comprises a minimum state-of-charge and a maximum state-of-charge (e.g. at the start or at the end of the discharging/charging event). The event discharge depth of the discharging/charging event can then depend on the difference between the maximum state-of-charge and the minimum state-of-charge or correspond to the difference between the maximum state-of-charge and the minimum state-of-charge.

The control unit is moreover designed to determine a discharge depth distribution on the basis of the discharge data, wherein the discharge depth distribution for different discharge depths indicates a number of discharging/charging events with a corresponding event discharge depth during the operation of the energy accumulator. To this end, the control unit can be designed to classify the different discharging/charging events into a plurality of discharge depth groups for different value ranges of discharge depths on the basis of the discharge data. On the basis of the number of discharging/charging events in a specific discharge depth group, the number of discharging/charging events can then be determined for this discharge depth group. The discharge depth distribution can thus be determined in the form of a discharge depth histogram. The discharge depth distribution can be repeatedly and/or continuously updated with new event data for newly detected discharging/charging events. Thus a constantly up-to-date discharge depth distribution for an energy accumulator can be determined in an efficient manner.

The control unit can be designed, during the determination of the number of discharging/charging events, to apply weighting to a discharging/charging event depending on the event discharge depth of the discharging/charging event, in order to determine a number of full-cycle-equivalent discharging/charging events. In other words, the number of discharging/charging events can be standardized to full-cycle-equivalent discharging/charging events. In this case, a full-cycle-equivalent discharging/charging event has a discharge depth of Y % (typically 100%) of the charging capacity or rated capacity of the energy accumulator (Y is a constant value, for example between 1 and 100, and preferably Y=100). The event discharge depth of a discharging/charging event typically has a value between 0% and 100%. A discharging/charging event can then be subject to a reckoning only in part, according to the event discharge depth, during the determination of the number of discharging/charging events, such that the number determined indicates full-cycle-equivalent discharging/charging events (with a discharge depth of Y %) in each case. Owing to the conversion or determination of full-cycle-equivalent discharging/charging events, improved monitoring of an energy accumulator can be made possible (particularly in order to determine the residual service life of the energy accumulator).

The control unit can further be designed to determine state data relating to a cumulative loading of the energy accumulator on the basis of the determined discharge depth distribution and on the basis of a discharge depth characteristic curve of the energy accumulator. Here, the discharge depth characteristic curve for different discharge depths can indicate a maximum permissible number of discharging/charging events (e.g. converted into full cycles, wherein one full cycle corresponds to the quantity of energy of a complete discharge, i.e. 100% of the rated capacity). In particular, the state data can be determined on the basis of a comparison of the determined discharge depth distribution with the discharge depth characteristic curve. Alternatively or additionally, the control unit can be designed to determine a distance measure (e.g. an average absolute or quadratic distance) between the discharge depth distribution and the discharge depth characteristic curve. The state data can then be determined on the basis of the distance measure. In this case, the state data can indicate or comprise e.g. the following: a residual service life of the energy accumulator; a spent proportion of a maximum anticipated loading of the energy accumulator; and/or an anticipated expiry time for the duration of service of the energy accumulator.

The control unit thus permits the state of an energy accumulator to be determined in an efficient and accurate manner. In particular, the residual service life of the energy accumulator can be determined.

Alternatively or additionally, the control unit can be designed, depending on the discharge depth distribution and depending on the discharge depth characteristic curve, to adapt an operating strategy for the energy accumulator. By adapting the operation, the operating strategy can be adapted to an energy source which is designed to supply electrical energy for the charging of the energy accumulator. Alternatively or additionally, the operating strategy can be adapted by adapting the operation of an electrical load which is designed to be operated by electrical energy from the energy accumulator. Alternatively or additionally, the operating strategy can be adapted by adapting a charge redistribution strategy for redistributing the charge of electrical energy between the energy accumulator and another energy accumulator.

By adapting the operating strategy, the duration of service of an energy accumulator can be prolonged. To this end, the control unit can be designed to determine, on the basis of the discharge depth distribution and on the basis of the discharge depth characteristic curve, that the operation of the energy accumulator features an excessively high number of discharging/charging events having event discharge depths within a specific range of values of discharge depths. The operating strategy for the energy accumulator can then be adapted such that the number of discharging/charging events having event discharge depths within the specific range of values is at least statistically reduced (in comparison with an unaltered operating strategy). The situation in which the permissible number of discharging/charging events (indicated by the discharge depth characteristic curve) is exceeded (and thus the potential duration of service of the energy accumulator is terminated) can thus be prevented in a reliable manner.

The control unit can be designed to adapt the operating strategy for the energy accumulator such that the discharge depth distribution, as the operation of the energy accumulator progresses, approaches the discharge depth characteristic curve. Alternatively or additionally, the control unit can be designed to adapt the operating strategy for the energy accumulator such that, as the operation of the energy accumulator progresses, a distance measure between the discharge depth distribution and the discharge depth characteristic curve is reduced. Alternatively or additionally, the control unit can be designed to adapt the operating strategy for the energy accumulator such that the discharge depth distribution does not intersect and/or exceed the discharge depth characteristic curve. In particular, the operating strategy for the energy accumulator can be adapted such that the available area below the discharge depth characteristic curve is exploited to the greatest and/or most uniform possible extent for different discharge depths. The potential duration of service of an energy accumulator can thus be maximized.

The control unit can be designed to determine a first discharge depth distribution at a first time point in the operation of the energy accumulator and to determine a second discharge depth distribution at a subsequent second time point of the energy accumulator. A predicted discharge depth distribution for a future time point can then be predicted on the basis of the first discharge depth distribution and the second discharge depth distribution. The state data regarding the cumulative loading of the energy accumulator can then be determined on the basis of the predicted discharge depth distribution. Alternatively or additionally, the operating strategy of the energy accumulator can be adapted on the basis of the predicted discharge depth distribution. The quality of the determined state data can thus be further enhanced and/or the duration of service of the energy accumulator can be further prolonged.

The discharge depth characteristic curve of the energy accumulator and/or of the energy accumulators can depend upon the following: a country in which the energy accumulator is operated; and/or climatic conditions during the operation of the energy accumulator; and/or one or more electrical loads which are supplied with electrical energy from the energy accumulator; and/or a user of a vehicle in which the energy accumulator is arranged. The costs of providing an energy accumulator can thus be reduced.

According to a further aspect, a method for monitoring an energy accumulator is described. The method comprises the detection, during operation of the energy accumulator, of event data relating to different discharging/charging events of the energy accumulator, wherein the event data for a discharging/charging event indicate an event discharge depth of the energy accumulator in the context of the discharging/charging event. The method moreover comprises the determination, on the basis of the discharge data, of a discharge depth distribution which indicates for different discharge depths a number of discharging/charging events having a corresponding event discharge depth during the operation of the energy accumulator. The method can moreover comprise the determination, on the basis of the discharge depth distribution and on the basis of a discharge depth characteristic curve, of state data relating to a cumulative loading of the energy accumulator. Alternatively or additionally, the method can comprise the adaptation of an operating strategy for the energy accumulator depending on the discharge depth distribution and the discharge depth characteristic curve.

According to a further aspect, an on-board electrical network, particularly for a vehicle or for a stationary or mobile application, is described, wherein the on-board network comprises an energy accumulator and the control unit described in the present document.

According to a further aspect, a road vehicle (particularly a private car or a heavy goods vehicle or a bus or a motorcycle) is described which comprises the control unit described in the present document and/or the on-board network described in the present document.

According to a further aspect, a software (SW) program is described. The SW program can be designed to be executed on a processor (e.g. on a control device of a vehicle) and as a result carry out the method described in the present document.

According to a further aspect, a storage medium is described. The storage medium can comprise an SW program, which is designed to be executed on a processor and as a result carry out the method described in the present document.

It should be observed that the methods, devices and systems described in the present document can be employed both individually and in combination with other methods, devices and systems described in the present document. Moreover, any aspects of the methods, devices and systems described in the present document can be mutually combined in a variety of ways. In particular, the features of the claims can be mutually combined in a variety of ways.

The invention is described in greater detail hereinafter with reference to exemplary embodiments.

DETAILED DESCRIPTION OF THE DRAWINGS

Figure 1:
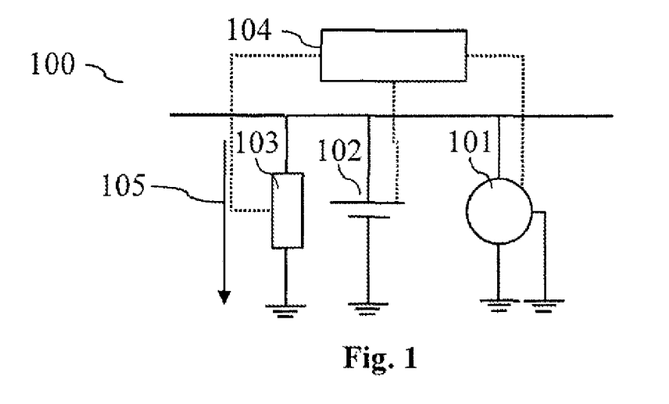
FIG. 1 shows exemplary components of an on-board electrical network.

As indicated at the outset, the present document addresses the reliable and efficient monitoring of an electrochemical energy accumulator, particularly in a vehicle. In this connection, FIG. 1 shows exemplary components of an on-board electrical network 100 of a vehicle. The on-board network 100 comprises an electrical energy accumulator 102, which is designed to store electrical energy. The on-board network 100 furthermore comprises one or more electrical loads 103 (e.g. a starter for an internal combustion engine of the vehicle, an air-conditioning system, lighting elements, an infotainment system, etc.) which can be operated by electrical energy from the energy accumulator 102. Furthermore, the on-board network 100 typically comprises an energy source 101 for the on-board electrical network 100, which energy source is designed to generate electrical energy or to provide the latter from another on-board network of the vehicle. The energy source 101 can comprise a generator and/or a DC voltage converter. Alternatively or additionally, the energy source 101 can comprise another energy accumulator. The on-board network 100 has an on-board network voltage 105 (e.g. 12V, 24V, 48V or a high voltage (for example, 300V or more)).

The different components 101, 102, 103 of the on-board network 100 can be controlled or regulated by means of a control unit 104 of the on-board network 100 or of the vehicle. In particular, the control unit 104 can be designed to set the state-of-charge of the energy accumulator 102 (e.g. by adapting the operation of the energy source 101 and/or of at least one load 103). Moreover, the control unit 104 can be designed to set the on-board network voltage 105. In other words, the control unit 104 can be designed to implement an operating strategy for the energy accumulator 102.

Figure 2:
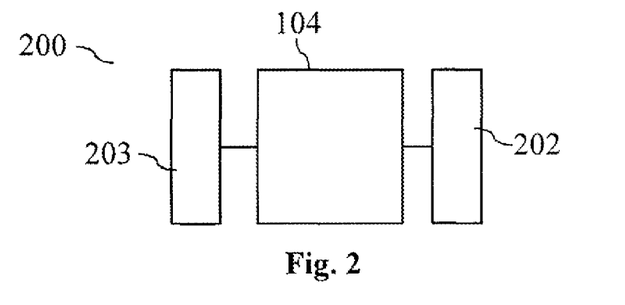
FIG. 2 shows exemplary components of a vehicle.
Figure 3:
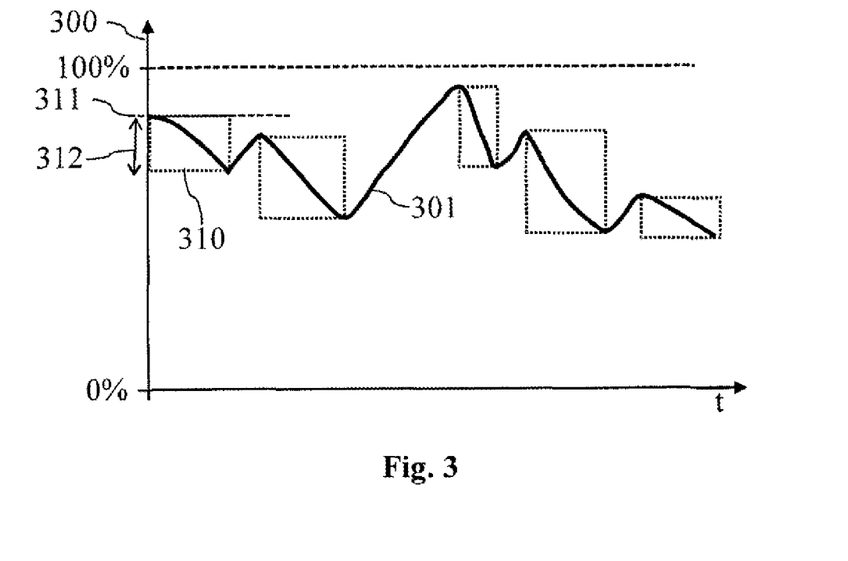
FIG. 3 shows an exemplary time profile of the state-of-charge of an energy accumulator during the travel of a vehicle.

FIG. 2 shows exemplary components of a vehicle 200. The vehicle 200 comprises the on-board network 100. In particular, the vehicle 100 comprises the control unit 104 which is designed to detect sensor data relating to the energy accumulator 102 by means of a sensor unit 202 (e.g. by means of a battery sensor). The sensor data can indicate the state-of-charge 300 of the energy accumulator 102 as a function of the time t. An exemplary time profile 301 of the state-of-charge 300 (i.e. SOC) of the energy accumulator 102 as a function of the time t is represented in FIG. 3. The vehicle 200 moreover comprises a storage unit 203, which is designed to save data relating to the energy accumulator 102, particularly the sensor data and/or event data derived therefrom.

Electrochemical energy accumulators 102 typically have a service life which depends on the discharge depth (i.e., on the depth of discharge (DoD)) of the energy accumulator 102. As a result, different usage profiles of an energy accumulator 102 (with different discharge depths) result in different service lives of the energy accumulator 102. For example, AGM (absorbent glass mat) batteries can be already entirely spent after approximately 300 full-cycle-equivalent discharging events at discharge depths of the order of 50% of the rated capacity. On the other hand, the service life of an AGM battery, at relatively low discharge depths of only 1% of the rated capacity, can be increased to several thousand full-cycle-equivalent discharging events. It is thus typically not readily possible to determine the cumulative state of loading or state of aging of an energy accumulator 102 on the basis of the count of a full-cycle-equivalent discharge value.

For example, during the shutdown of the (internal combustion) engine of a vehicle 200, the total discharge quantity of the energy accumulator 102 during the travel of the vehicle 200 can be determined, and saved in the storage unit 203 (e.g. "5 Ah discharge quantity"). The determined total discharge quantity can then be taken into account as a proportional full-cycle-equivalent discharging event in the determination of the residual service life of the energy accumulator 102. However, a rough data recording of this type (in the absence of an association with individual discharging/charging events that actually occur, or in the absence of association with a specific discharge depth) typically results in a relatively inaccurate determination of the cumulative state of loading of an energy accumulator 102. In consequence, faulty servicing measures (e.g. premature or tardy replacement of an energy accumulator 102) can potentially be performed. Moreover, faulty measures for the reduction of the loading of an energy accumulator 102 (e.g. the disabling or downrating of an automatic engine switch-off function) can also be performed.

The control unit 104 can be designed to detect event data relating to individual discharging/charging events of an energy accumulator 102 on the basis of sensor data, and to save said event data in the storage unit 203. FIG. 3 shows an exemplary time profile 301 of the state-of-charge 300 of an energy accumulator 102 during the operation of a vehicle 200. As can be seen from FIG. 3, the state-of-charge 300 can intermittently fall (on the grounds of the tapping of electrical energy for the operation of one or more loads 103). On the other hand, in other time intervals, the state-of-charge 300 can rise (as a result of the operation of the energy source 101, for instance for the recovery of braking energy). A subregion of the time profile 301 of the state-of-charge between the start and the end of a coherent discharging process can be considered to be a single discharging/charging event 310 (i.e. a discharging and/or charging event or, in short, an event 310). Alternatively or additionally, a subregion of the time profile 301 of the state-of-charge between the start and the end of a coherent charging process can be considered to be a single discharging/charging event 310 (i.e. a discharging and/or charging event or, in short, an event 310). As can be seen from FIG. 3, during the operation of a vehicle 200 (particularly even during a single journey of a vehicle 200), a multiplicity of discharging/charging events 310 typically occur.

For a discharging/charging event 310, event data can be detected and saved (on the basis of sensor data). Exemplary event data are as follows:
the event discharge depth 312; this exhibits e.g. the difference in the state-of-charge 300 of the energy accumulator 102 between the start and the end of the discharging/charging event 310; and
the event state-of-charge 311 at the start and/or the end of an event 310.

Thus, during a single journey, event data for a multiplicity of events 310 can be detected and saved. This can be repeated for a multiplicity of journeys. These event data can then be evaluated by the control unit 104, in order to determine the cumulative state of loading of the energy accumulator 102 in an accurate manner.

Figure 4A:
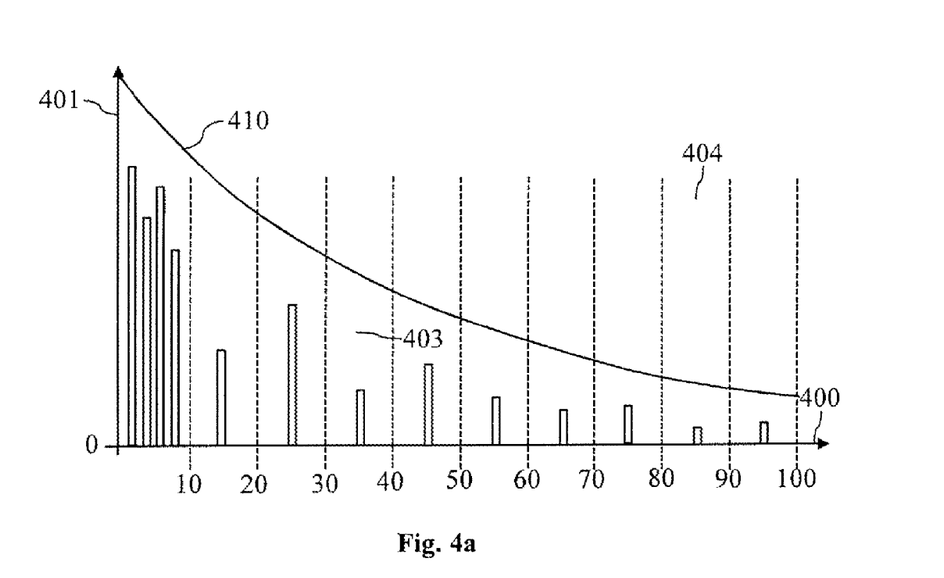
FIG. 4a shows an exemplary charge depth histogram.

FIG. 4a shows an exemplary discharge depth histogram 403 (as an example of a discharge depth distribution, converted into a number of full discharge cycles), which can be established on the basis of the event data of the multiplicity of events 310. In particular, the events 310, according to the respective event discharge depths 312, can be classified into different discharge depth groups 404 for different ranges of values of the discharge depth 404. In the example represented, discharge depth groups 404 are provided for the ranges 10-20%, 20-30%, etc. Moreover, in the example represented, the range of 0-10% is subdivided into a plurality of subregions (on the grounds of the relatively high number of events 310 in this range of values).

For each of the discharge depth groups 404, a frequency value 401 can be determined, wherein the frequency value 401 can indicate the number of full-cycle-equivalent charging/discharging events having the respective value for the discharge depth 400. For the determination of the frequency value or the number 401 for a discharge depth group 404, first the events 310 can be identified which have an event discharge depth 312 that falls within the range of values of this discharge depth group 404. Each event 310 identified can then be weighted depending on the event discharge depth 312, as an event 310 typically corresponds only to a proportional full-cycle-equivalent charging/discharging event. For example, an event 310 having an event discharge depth 312 of x (e.g. where x=10%) corresponds only to an $x^{th}$ proportion of a full-cycle-equivalent charging/discharging event.

Overall, for different discharge depth groups 404, different frequency values 401 can thus be determined. The discharge depth histogram 403 is then formed by the frequency values 401 as a function of the discharge depths 400 of the discharge depth groups 404. The discharge depth histogram 403 thus represents a detailed distribution of full-cycle-equivalent charging/discharging events of an energy accumulator 102 as a function of the discharge depths 400.

An energy accumulator 102 can have a discharge depth characteristic curve 410 which indicates the maximum permissible frequency or number 401 of full-cycle-equivalent charging/discharging events as a function of the discharge depth 400. In particular, the area below the discharge depth characteristic curve 410 can define an operating range for an energy accumulator 102 in which the energy accumulator 102 can operate, before the energy accumulator 102 has reached a scheduled end of service or end of life and thus should be replaced.

The control unit 104 can be designed to compare the discharge depth histogram 403 with the discharge depth characteristic curve 410 of the energy accumulator 102. On the basis of the comparison, the cumulative state of operation of the energy accumulator 102 can then be determined in an accurate manner. Alternatively or additionally, on the basis of the comparison, the operating strategy for the energy accumulator 102 can be adapted, in order to increase the service life or the duration of service of the energy accumulator 102.

Optionally, during the determination of the discharge depth distribution 403 of an energy accumulator 102, the event state-of-charge 311 of the individual events 310 can additionally be take into account. For example, a discharge depth distribution 403 can be determined as a two-dimensional or multi-dimensional function of the event discharge depth 312 and the event state-of-charge 311. Moreover, a discharge depth characteristic curve 410 for the energy accumulator 102 can be provided as a two-dimensional or multi-dimensional function of the event discharge depth 312 and the event state-of-charge 311. As a result of additionally taking the event state-of-charge 311 into account, the accuracy of the determined state-of-loading of the energy accumulator 102 and/or the service life of an energy accumulator 102 can be further enhanced.

Figure 4B:
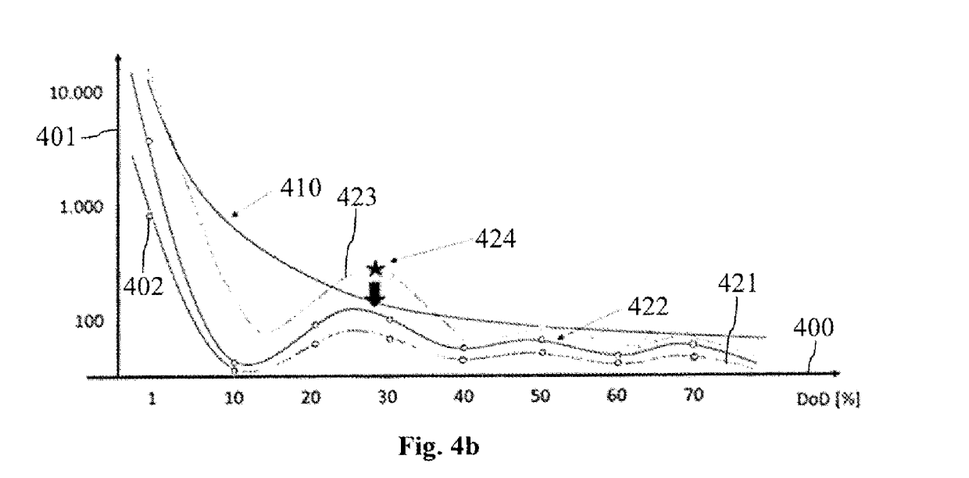
FIG. 4b shows an exemplary prediction of the loading of an energy accumulator.

FIG. 4b shows different discharge depth histograms 421, 422 for an energy accumulator 102 at different time points (e.g. after 2 years or after 4 years of operation of the energy accumulator 102). The discharge depth histograms 421, 422 are represented in FIG. 4b as (interpolated) discharge depth distributions. On the basis of one or more measured discharge depth histograms 421, 422, a future discharge depth histogram 423 at a future time point can be predicted (e.g. under the assumption that the operation or the operating strategy of the on-board network 100 and of the energy accumulator 102 continue unchanged, even in the future). On the basis of the predicted discharge depth histogram 423, the service life of the energy accumulator 102 that is still available can then be predicted. For example, it can be predicted that, at a future time point, the predicted discharge depth histogram 423 intersects the discharge depth characteristic curve 410 of the energy accumulator 102 (see point 424), and the service life of the energy accumulator 102 will thus have expired.

Alternatively or additionally, one or more measures can be determined on the basis of a predicted discharge depth histogram 423 in order to prolong the service life of an energy accumulator 102. For example, it can be determined that the maximum permissible service life of the energy accumulator 102 will be achieved foreseeably on the basis of the frequency value 401 in a specific discharge depth group 404 (see point 424 in FIG. 4b). One or more measures can then be taken to reduce the frequency of events 310 having event discharge depths 312 from the specific discharge depth group 404 (and, to this end, to increase the frequency or the number 401 of events 310 having other event discharge depths 312). In particular, one or more measures can be initiated in order to exploit the available area below the discharge depth characteristic curve 410 of the energy accumulator 102 to the greatest possible extent, and to thus exploit the available service life of the energy accumulator 102 to the greatest possible extent. In particular, the active displacement of the discharging/charging events 310 in the direction of smaller charge/discharge quantities can prolong the service life of the energy accumulator 102.

Thus, during the operation of an on-board network 100 or of an energy accumulator 102, a detailed detection of the actual cyclical loading of the energy accumulator 102 is performed. To this end, the full-cycle-equivalent events realized, depending on the discharge depths 400 of the individual events that arise, can be detected and saved after each journey. Moreover, still further data relating to an event 310 can be detected and saved (such as e.g. the temperature of the energy accumulator 102 during the event 310).

The object of the detailed detection of event data with reference to individual discharging/charging events 310 is e.g. to permit the energy accumulator 102 for an on-board network 100 to be dimensioned and/or selected depending on the country of operation of the vehicle 200, depending on equipment variants of the vehicle 200 and/or depending on individual users of the vehicle 200. Moreover, a maximum possible utilization of operating ranges of an energy accumulator 102 can be brought about, which makes it possible to reduce the required dimensioning of energy accumulators 102 and/or to prolong the service life of energy accumulators 102. Moreover, the operating strategy of an on-board network 100 can be preventatively adapted, in order to reduce the loading for an energy accumulator 102.

The individual charging/discharging events 310 of the energy accumulator can be saved directly in a histogram or in a distribution 403 (e.g. after each journey or after each detected event 310). In particular, a histogram 403 saved in the storage unit 203 can be updated during the journey, or after each journey of a vehicle 200. An up-to-date comparison with the service life guarantee characteristic curve 410 of the energy accumulator 102 can then be performed in each case.

A cycle throughput of the energy accumulator 102 can thus be forecast in a country-, equipment- and/or user-specific manner. In turn, this permits an early response as a result of adapting the operating strategy of the on-board network 100.

The measures described in the present document are advantageous particularly for an AGM battery. However, these measures are also applicable to energy accumulators 102 of other types. Moreover, the measures described can be employed in multi-accumulator on-board networks 100. On-board networks 100 of this type have the option of redistributing the charge of electrical energy between different energy accumulators 102, in order to increase the service life of the energy accumulators 102 by adapting a charge redistribution strategy.

Figure 5:
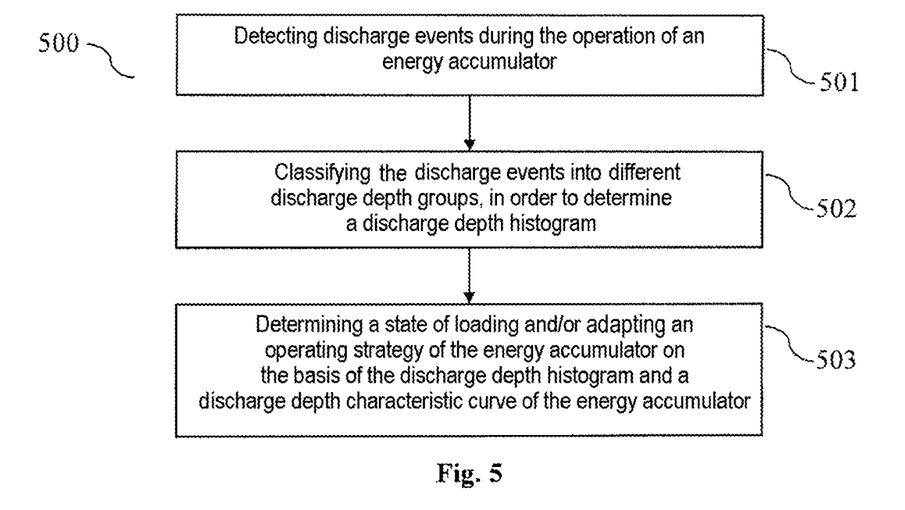
FIG. 5 shows a flow diagram of an exemplary method for monitoring an energy accumulator.

FIG. 5 shows a flow diagram of an exemplary method 500 for monitoring an energy accumulator 102. The method 500 can be carried out e.g. by the control unit 104 of an on-board network 100 and/or of a vehicle 200.

The method 500 comprises the detection 501, during the operation of the energy accumulator 102, of event data relating to different discharging/charging events 310 of the energy accumulator 102. In this case, event data for the entire operation of the energy accumulator 102 (since its entry into service) can be detected and saved. A discharging/charging event 310 can comprise here a defined number N of charging processes and/or discharging processes (in particular, exactly one charging process and/or discharging process). In this case, a discharging process commences directly upon the completion of a preceding charging process, and ends directly upon the commencement of a subsequent charging process. In a corresponding manner, a charging process commences directly upon the completion of a preceding discharging process and ends directly upon the commencement of a subsequent discharging process. The discharging of the energy accumulator 102 is typically brought about by providing electrical energy for one or more electrical loads 103. On the other hand, the charging of the energy accumulator 102 is typically brought about by providing electrical energy by means of an energy source 101.

The event data for a discharging/charging event 310 show an event discharge depth 312 of the energy accumulator 102 in the context of the discharging/charging event 310.

The method 500 moreover comprises the determination 502, on the basis of the discharge data, of a discharge depth distribution 403 (particularly of a discharge depth histogram 403) which, for different discharge depths 400, indicates a frequency or a number 401 of discharging/charging events 310 having a corresponding event discharge depth 312 during the operation of the energy accumulator 102. In this case, the frequency or the number 401 can constitute values for full-cycle-equivalent discharging/charging events.

The method 500 further comprises the determination 503, on the basis of the discharge depth distribution 403 and on the basis of a discharge depth characteristic curve 410 of the energy accumulator 102, of state data relating to a cumulative loading of the energy accumulator 102. In particular, a prediction can be made relating to the residual service life of the energy accumulator 102. Alternatively or additionally, the method 500 comprises adapting the operating strategy for the energy accumulator 102 and/or for operating the energy accumulator 102, depending on the discharge depth distribution 403 and depending on the discharge depth characteristic curve 410.

By means of the comparison, as described in the present document, of established histograms or distributions 403 with the service life guarantee characteristic curve 410 of an energy accumulator 102, it is possible to forecast a country-, equipment- and/or user-specific cyclical throughput of the energy accumulator 102. It is thus possible to adjust an operating strategy for the energy accumulator 102 in good time. Moreover, a country-, equipment- and/or user-specific configuration of an energy accumulator 102 is thus made possible.

The measures described in the present document permit maximum utilization of an available and/or permissible operating range of an energy accumulator 102. Thus, a minimum possible dimensioning of an energy accumulator 102 with a consistently high quality can be achieved. Owing to monitoring events 310 for a multiplicity of (structurally identical) energy accumulators 102, reliable monitoring can be carried out. Moreover, forecasting models for forecasting the service life of energy accumulators 102 can thus be established. By means of the measures described, preventative quality management can be performed. Moreover, early intervention can be undertaken by means of robust operating strategies which are adapted to the storage technology, e.g. on the basis of a cyclization displacement of events 310 that prolongs the service life into ranges of values for discharge depths having a relatively high number of still available full-cycle-equivalent events. To this end, e.g. recovery phases of a vehicle 200 can be shortened or extended.

The measures described in the present document can also be employed in multi-accumulator systems having the same or different network voltages (e.g. 12/12V, 48/12V, HV (high-voltage)/12V on-board networks), as charge redistribution strategies that prolong the service life can be implemented between the different energy accumulators, in order to exploit the full guaranteed cyclization of the energy accumulators 102 employed. The measures described also make it possible to establish or determine service life characteristic curves 410 for storage technologies (on the basis of the event data of the individual events 310 of a multiplicity of structurally identical energy accumulators 102). These characteristic curves 410 can then be employed for the monitoring of individual energy accumulators 102 during the operation of the energy accumulators 102. The operational reliability of an energy accumulator 102 and/or the permissible service life of an energy accumulator 102 can thus be improved.

The present invention is not limited to the exemplary embodiments shown. In particular, it should be observed that the description and the figures are only intended to illustrate the principle of the proposed methods, devices and systems.

What is claimed is:

1. A control unit for an energy accumulator, comprising: the control unit, wherein the control unit is configured to:
    detect, during operation of the energy accumulator, event data relating to different discharging/charging events of the energy accumulator, wherein the event data for a discharging/charging event indicate an event discharge depth of the energy accumulator in the context of the discharging/charging event;
    determine a discharge depth distribution on the basis of discharge data that, for different discharge depths, indicates a number of discharging/charging events having a corresponding event discharge depth during the operation of the energy accumulator;
    determine state data relating to a cumulative loading of the energy accumulator on the basis of the discharge depth distribution and on the basis of a discharge depth characteristic curve of the energy accumulator, and/or adapt an operating strategy for the energy accumulator depending on the discharge depth distribution and the discharge depth characteristic curve;
    determine a first discharge depth distribution at a first time point of the operation of the energy accumulator;
    determine a second discharge depth distribution at a subsequent second time point of the energy accumulator;
    predict a predicted discharge depth distribution for a future time point on the basis of the first discharge depth distribution and the second discharge depth distribution; and
    determine the state data on the basis of the predicted discharge depth distribution and/or adapt the operating strategy of the energy accumulator on the basis of the predicted discharge depth distribution.

2. The control unit according to claim 1, wherein the discharge depth characteristic curve for different discharge depths indicates a maximum permissible number of discharging/charging events; and
the control unit is further configured to:
    determine a distance measure between the discharge depth distribution and the discharge depth characteristic curve; and
    determine the state data on the basis of the distance measure.

3. The control unit according to claim 1, wherein the control unit is further configured to:
    classify the different discharging/charging events into a plurality of discharge depth groups for different value ranges of discharge depths on the basis of the discharge data; and
    determine a number of discharging/charging events for this discharge depth group on the basis of a number of discharging/charging events in a discharge depth group.

4. The control unit according to claim 1, wherein the control unit is further configured to:
    determine, on the basis of the discharge depth distribution and of the discharge depth characteristic curve, that the operation of the energy accumulator has a number of discharging/charging events, having event discharge depths in a specific range of values of discharge depths, that exceeds a maximum permissible number; and
    adapt the operating strategy for the energy accumulator such that the number of discharging/charging events having event discharge depths in the specific range of values is at least statistically reduced.

5. The control unit according to claim 1, wherein the control unit is further configured to control the energy accumulator such that, as the operation of the energy accumulator progresses, a distance measure between the discharge depth distribution and the discharge depth characteristic curve decreases but remains greater than zero.

6. The control unit according to claim 5, wherein the operating strategy is adapted by:

adapting the operation of an energy source which is designed to provide electrical energy for charging the energy accumulator; and/or adapting the operation of an electrical load which is designed to be operated by electrical energy from the energy accumulator; and/or redistributing a charge of electrical energy between the energy accumulator and another energy accumulator in order to increase a service life or a duration of service of the energy accumulator.

7. The control unit according to claim 1, wherein the state data comprise or indicate one of more of the following:

a residual service life of the energy accumulator;

an amount of the maximum anticipated loading of the energy accumulator that has already been used; and an expiration time for a duration of service of the energy accumulator.

8. The control unit according to claim 1, wherein the control unit is configured to apply weighting to the discharging/charging event depending on the event discharge depth of the discharging/charging event, in order to determine a number of full-cycle-equivalent discharging/charging events.

9. The control unit according to claim 1, wherein the energy accumulator, in the context of the discharging/charging event, has a minimum state-of-charge and a maximum state-of-charge; and the event discharge depth of the discharging/charging event depends on a difference between the maximum state-of-charge and the minimum state-of-charge.

10. The control unit according to claim 1, wherein at least one of:

a discharging/charging event extends over N discharging processes and/or N charging processes of the energy accumulator, wherein N is equal to or less than 10, 5, 4, 3, or 2, or N is 1;

a discharging/charging event is delimited by a transition between a charging process and a discharging process and/or by a transition between a discharging process and a charging process; and a start and/or an end of a discharging/charging event is triggered by an interruption of a charging process of the energy accumulator.

11. The control unit according to claim 1, wherein the energy accumulator comprises a lead-acid battery and/or an AGM battery.

12. The control unit according to claim 1, wherein the discharge depth characteristic curves of the energy accumulator and/or the energy accumulators depend on at least one of:

climatic conditions, including temperature, during the operation of the energy accumulator;

one or more electrical loads which are supplied with electrical energy from the energy accumulator; and a user of a vehicle in which the energy accumulator is arranged.

13. A method for monitoring an energy accumulator, comprising:

detecting, during operation of the energy accumulator, event data relating to different discharging/charging events of the energy accumulator, wherein the event data for a discharging/charging event indicate an event discharge depth of the energy accumulator in the context of the discharging/charging event;

determining, on the basis of discharge data, a discharge depth distribution which for different discharge depths indicates a number of discharging/charging events having a corresponding event discharge depth during the operation of the energy accumulator;

determining, on the basis of the discharge depth distribution and on the basis of a discharge depth characteristic curve of the energy accumulator, state data relating to a cumulative loading of the energy accumulator and/or adapting an operating strategy for the energy accumulator depending on the discharge depth distribution and the discharge depth characteristic curve;

determining a first discharge depth distribution at a first time point of the operation of the energy accumulator;

determining a second discharge depth distribution at a subsequent second time point of the energy accumulator;

predicting a predicted discharge depth distribution for a future time point on the basis of the first discharge depth distribution and the second discharge depth distribution; and determining the state data on the basis of the predicted discharge depth distribution and/or adapt the operating strategy of the energy accumulator on the basis of the predicted discharge depth distribution.

* * * * *